United States Patent [19]

Miller et al.

[11] Patent Number: 5,027,552

[45] Date of Patent: Jul. 2, 1991

[54] REDUNDANT SENSING EDGE FOR A DOOR FOR DETECTING AN OBJECT IN PROXIMITY TO THE DOOR EDGE

[75] Inventors: Norman K. Miller; Bearge D. Miller, both of Concordville; Anatoly Galperin, Philadelphia, all of Pa.

[73] Assignee: Miller Edge, Inc., Concordville, Pa.

[21] Appl. No.: 568,381

[22] Filed: Aug. 16, 1990

[51] Int. Cl.⁵ .................................................. E05F 15/02
[52] U.S. Cl. .......................................... 49/27; 49/28; 49/31; 49/506
[58] Field of Search ............. 49/27, 28, 25, 31, 26, 49/42, 43, 44, 506

[56] References Cited

U.S. PATENT DOCUMENTS

| | | | |
|---|---|---|---|
| 2,843,690 | 7/1958 | Miller | 200/61.43 |
| 3,243,540 | 3/1966 | Miller | 200/86 |
| 3,303,303 | 2/1967 | Miller | 49/27 X |
| 3,315,050 | 4/1967 | Miller | 200/61.43 |
| 3,321,592 | 5/1967 | Miller | 200/61.43 |
| 3,462,885 | 8/1969 | Miller | 49/488 |
| 3,754,176 | 8/1973 | Miller | 318/266 |
| 3,812,313 | 5/1974 | Wolf et al. | 200/86 R |
| 3,855,733 | 12/1974 | Miller | 49/27 X |
| 3,867,595 | 2/1975 | Ramsey et al. | 200/86 R |
| 3,896,590 | 7/1975 | Miller | 49/27 X |
| 4,051,336 | 9/1977 | Miller | 49/27 X |
| 4,137,116 | 1/1979 | Miller | 156/269 |
| 4,200,777 | 4/1980 | Miller | 200/85 A |
| 4,261,440 | 4/1981 | Jacoby | 49/28 X |
| 4,349,710 | 9/1982 | Miller | 200/61.43 |
| 4,362,911 | 12/1982 | Sears et al. | 200/5 A |
| 4,396,814 | 8/1983 | Miller | 200/61.43 |
| 4,401,896 | 8/1983 | Fowler et al. | 307/118 |
| 4,475,308 | 10/1984 | Heise et al. | 49/42 |
| 4,497,989 | 2/1985 | Miller | 200/86 R |
| 4,661,664 | 4/1987 | Miller | 200/86 R |
| 4,773,155 | 9/1988 | Buchien | 29/622 |
| 4,785,143 | 11/1988 | Miller | 200/61.43 |
| 4,894,952 | 1/1990 | Trett et al. | 49/27 X |
| 4,908,483 | 3/1990 | Miller | 200/61.43 |
| 4,954,673 | 9/1990 | Miller | 200/61.43 |

Primary Examiner—Philip C. Kannan
Attorney, Agent, or Firm—Panitch Schwarze Jacobs & Nadel

[57] ABSTRACT

A redundant sensing edge for a door to protect persons, equipment and the door from impact damage by actuating a device upon detecting an object in proximity to the door edge. The sensing edge includes an elongate outer sheath compressible upon application of external pressure. A force sensing switch is positioned within the elongate outer sheath for sensing the application of force to the sheath. Upon force being applied to the sheath, the force sensing switch actuates the device for controlling the door. The sensing edge also includes a proximity sensing switch for detecting the presence of an animate object in proximity to the door edge. The proximity sensing switch includes an electrical circuit positioned near the elongate sheath and a control circuit for detecting changes in the capacitance of the electrical circuit. An animate object in proximity to the elongate sheath changes the capacitance of the electrical circuit. The control circuit detects the change in capacitance and in response to the change in capacitance actuates the device. Thus, the device is actuated either upon the detected presence of an animate object in proximity to the sheath or upon the application of force to the sheath, thereby giving the sensing edge redundancy.

13 Claims, 2 Drawing Sheets

REDUNDANT SENSING EDGE FOR A DOOR FOR DETECTING AN OBJECT IN PROXIMITY TO THE DOOR EDGE

FIELD OF THE INVENTION

The present invention relates to a sensing edge for a door and, more particularly, to a redundant sensing edge for a door to protect persons, equipment and the door from impact damage by actuating a device upon detecting an object in proximity to the door edge.

BACKGROUND OF THE INVENTION

Employing force sensing switches in sensing edges for doors is generally known. Such sensing edges generally include an elongate outer sheath in which a force sensing switch is positioned. Upon the application of force to the sheath, the force sensing switch actuates suitable control circuitry for controlling the movement of the door. The force sensing switch positioned within the sheath typically comprises a pair of flexible, electrically conductive sheets positioned on the upper and lower sides of a layer of nonconducting foam having a plurality of openings extending therethrough from the upper to the lower side. Upon application of force to the sheath, the conductive sheets are deflected into electrically conductive engagement with each other, to thereby actuate suitable control circuitry for controlling the door.

Conventional sensing edges, including the above described switch, are not as sensitive and do not respond as quickly as that contemplated in the present invention. For instance, before the control circuitry is actuated, the conductive sheets must travel the full distance therebetween, in order to make electrical connection. Moreover, if the force applied to the sheath is distributed over a substantial area, the force may, in certain circumstances, not be sufficient to actuate such a switch. Therefore, switches of this type, while sufficient for their intended purpose, may not respond quickly enough to sufficiently protect animate objects in the path of the door from impact damage.

Other types of force sensing switches which can be positioned within the sheath are pressure switches. Such switches typically consist of an elongate tubular member, one end of which is sealingly closed. The other end of the tubular member is in fluid communication with a pressure sensitive switch. The tubular member is longitudinally positioned within the sheath such that upon the application of force to the sheath, pressure within the tubular member is increased and communicated to the pressure sensitive switch to thereby actuate suitable control circuitry for controlling the door.

Although somewhat more sensitive than the first type of force sensing switch discussed previously, the pressure switches still require direct force be applied to the sheath before the control circuitry is actuated. Thus, again, such switches do not respond quickly enough to protect animate objects from the impact of the door.

Employing proximity sensors on door edges to detect the presence of objects in proximity to the door edge is also generally known. Such proximity sensors typically comprise a plurality of local motion detectors spaced closely together along the door edge. Motion near any one detector is detected and suitable control circuitry for controlling the door is actuated. A problem with this type of proximity sensor is that the large number of local motion detectors required make such a sensor costly and difficult to manufacture.

Other types of proximity sensors comprise one or more infrared beams extending from an emitter at one end of the door edge to a detector at the other end of the door edge. The presence of an object in the path of a beam will block the beam from reaching its respective detector thereby actuating the control circuitry. This type of proximity sensor can also be costly since a plurality of beams are needed to detect the presence of objects on all sides of the door edge. Also, manufacturing and adjustment are difficult since each beam must be carefully positioned to fall directly on its respective detector.

A common problem with both types of proximity sensors is that if the sensors fail, no other means of protection is available. Thus, prior art proximity sensors are costly, difficult to manufacture, and do not provide a back-up sensor in the event that the proximity sensor fails.

Consequently, there exists a need for a redundant sensing edge capable of detecting both force applied to the sensing edge, as well as objects in proximity to the sensing edge. Such a redundant sensing edge would fulfill two significant needs. First, the redundancy of the sensing edge would prevent total failure of the sensing edge in the event one of the sensing means ceases to operate. Secondly, the proximity sensing ability of the redundant sensing edge would better protect animate objects from damage by the door since the device is actuated before impact occurs.

The present invention is directed to a redundant sensing edge for a door to protect persons, equipment and the door from impact damage by actuating a device upon detecting an object in proximity to the door edge. The sensing edge of the present invention overcomes the problems inherent in the prior art by incorporating both a force sensing switch and a proximity sensing switch, so that the device can be actuated before actual impact occurs and redundancy is provided in the event that one of the switches ceases to operate. In addition, the proximity sensing switch of the present invention is easier to manufacture and less costly than prior art proximity sensors.

SUMMARY OF THE INVENTION

Briefly stated, the present invention comprises a redundant sensing edge for a door to protect persons, equipment and the door from impact damage by actuating a device upon detecting an object in proximity to the door edge. The sensing edge comprises an elongate outer sheath compressible upon application of external pressure. The sheath is preferably attached to the door edge and forms a wall with an interior surface and an exterior surface. A force sensing means is positioned at least partially within the sheath for sensing the application of force upon the sheath and for actuating the device upon the sensing of the force being applied to the sheath. A proximity sensing means is positioned proximate the wall of the sheath for sensing the presence of an animate object in proximity to the sheath and for actuating the device upon the detection of an animate object in proximity to the sheath. Thus, the device is actuated either upon the detected presence of an animate object in proximity to the sheath or upon the application of force to the sheath.

BRIEF DESCRIPTION OF THE DRAWINGS

The foregoing summary, as well as the following detailed description of the preferred embodiment, is better understood when read in conjunction with the appended drawings. For the purpose of illustrating the invention, there is shown in the drawings an embodiment which is presently preferred, it being understood, however, that the invention is not limited to the specific methods and instrumentalities disclosed. In the drawings.

DESCRIPTION OF PREFERRED EMBODIMENT

Certain terminology is used in the following description for convenience only and is not limiting. The words "right," "left," "lower" and "upper" designate directions in the drawings to which reference is made. The words "inwardly" and "outwardly" refer to directions toward and away from, respectively, the geometric center of the redundant sensing edge and designated parts thereof. The terminology includes the words above specifically mentioned, derivatives thereof and words of similar import.

Figures 1, 2:
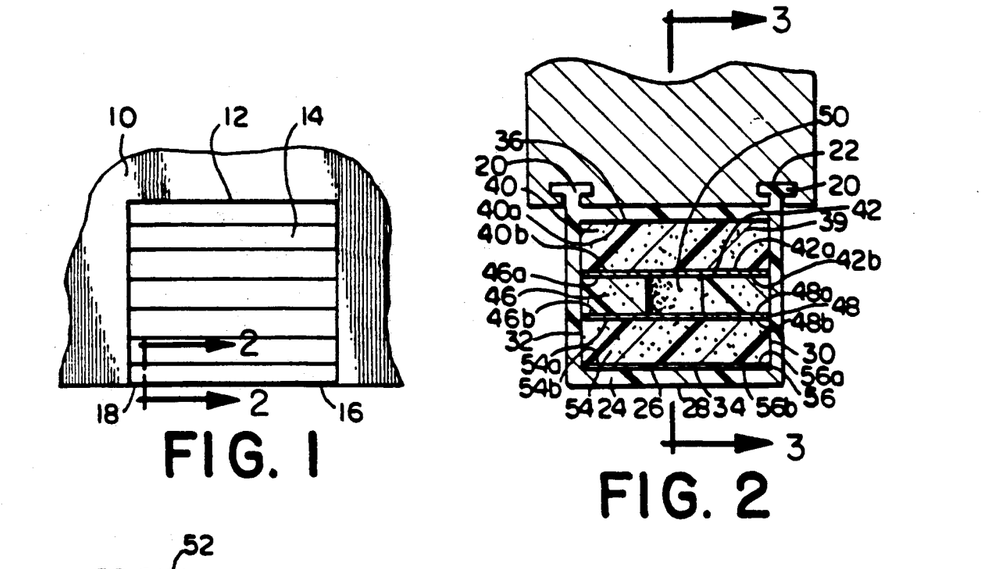
FIG. 1 is an elevational view showing a door construction including a sensing edge in accordance with the present invention.
FIG. 2 is a greatly enlarged cross-sectional view of the sensing edge of FIG. 1 in accordance with the preferred embodiment of the invention taken along line 2—2 of FIG. 1.

Referring to the drawings in detail, wherein like numerals indicate like elements throughout, there is shown in FIGS. 1-3 and 6, a preferred embodiment of a redundant sensing edge in accordance with the present invention. There is shown in FIG. 1, a building wall 10 having a doorway 12 provided with a door 14. While the door 14, as illustrated, is an overhead door having a redundant sensing edge 16 in accordance with the present invention along its lower side or leading edge 18, it is within the spirit and scope of the invention to incorporate the sensing edge 16, described hereinafter, along the edge of any door structure, such as vertically disposed or horizontally moveable doors (not shown) as desired. Moreover, it is understood by those skilled in the art, that the redundant sensing edge 16 is not limited to use in connection with doors, but can be used for other applications, such as automatic windows.

Referring now to FIG. 2, the sensing edge 16 and the door 14 include securing means for fixing the sensing edge 16 to the leading edge 18 of the door 14. In the presently preferred embodiment, securing means are a pair of T-shaped members 20 which complement T-shaped slots 22 in the lower surface of the door 14. Of course, the sensing edge 16 may be secured to the door 14 in any other suitable manner, for instance, with a single T-shaped member and complementary T-shaped slot (not shown) or a dovetail slot configuration. Moreover, it is also within the spirit and scope of the invention, to secure the sensing edge 16 to the leading edge 18 of the door 14 by an adhesive (not shown) applied between the leading edge 18 and the peripheral face of the sensing edge 16.

Figure 3:
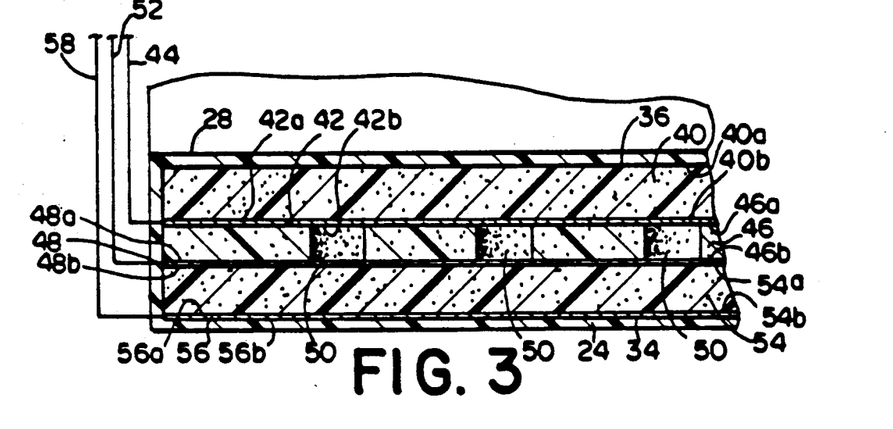
FIG. 3 is a cross-sectional view of the sensing edge shown in FIG. 2 taken along line 3—3 of FIG. 2.

Referring now to FIGS. 2 and 3, the sensing edge 16 is comprised of an elongate outer sheath 24 compressible upon application of external pressure. The sheath 24 forms a wall with an interior surface 26 and an exterior surface 28. It is preferred that the sheath 24 have a generally constant cross-sectional outline, extending closely along the leading edge 18 of the door 14. In the present embodiment, the sheath 24 is generally of rectangular cross-section, but may be of any other suitable shape, such as circular or semi-circular (not shown).

In the present embodiment, it is preferred that the sheath 24 be advantageously fabricated of a form-retaining, but flexible material, such as rubber. However, it is understood by those skilled in the art, that the sheath can be made of any form-retaining, flexible material.

In the present embodiment, it is preferred that the sheath 24 include a front wall 30, a back wall 32, a lower wall 34, and an upper wall 36. The front and back walls 30, 32 upstand integrally from opposite side edges of the lower wall 34. The upper wall 36 extends between the upper edges of the front and back walls 26, 28 in close facing or complementary relation with the leading edge 18 of the door 14.

The T-shaped members 20 are formed with the sheath 24 along the upper wall 36 for releasably interconnecting the sheath 24 with the leading edge 18, thereby facilitating quick and easy mounting or removal and replacement of the sensing edge 16 with respect to the door 14. As shown in FIG. 3, end walls 38 close and seal the ends of the sheath 24, however, it is within the scope and spirit of the present invention to leave the ends of the sheath 24 open.

Referring still to FIGS. 2 and 3, force sensing means substantially occupies the interior area of the sheath 24. In the preferred embodiment, the force sensing means comprises a standard multi-layered force sensing switch 39, as described below.

In the preferred embodiment, the force sensing switch 39 comprises a first sheet of resiliently compressible material 40 which is positioned within the sheath 24 and includes a first face 40a and a second face 40b. The first face 40a of the first sheet of resiliently compressible material 40 is in engagement or corresponding facing relationship with the upper wall 36 of the sheath 24.

In the present embodiment, it is preferred that the first sheet of resiliently compressible material 40 and succeeding layers and sheets, described hereinafter, be generally sized to complement the internal configuration of the sheath 24. However, it is understood by those skilled in the art, that the first sheet of resiliently compressible material 40 and succeeding layers can be sized as wide or as narrow as desired, and be virtually of any length for accommodating different structures and uses.

In the present embodiment, it is preferred that the first sheet of resiliently compressible material 40 be constructed of generally soft foam rubber. It is understood by those skilled in the art, that the first sheet of resiliently compressible material 40 can be constructed of either closed or open cell foam rubber or of other materials having similar properties.

Just below (when viewing FIGS. 2 and 3) the first sheet of resiliently compressible material 40 is a first sheet of flexible, electrically conductive material 42, engaged therewith, and having a first face 42a and a second face 42b. The first face 42a of the first sheet of flexible, electrically conductive material 42 is in engagement or in corresponding facing relationship with the second face 40b of the first sheet of resiliently compressible material 40.

In the present embodiment, it is preferred that the first sheet of flexible, electrically conductive material 42 be generally thin and preferably be constructed of aluminum or aluminum foil. However, it is within the spirit and scope of the invention, to construct the first sheet of flexible, electrically conductive material 42 of other materials, such as copper or brass.

As shown in FIG. 3, an electrical conductor or wire 44 is electrically connected to the first sheet of flexible, electrically conductive material 42 preferably by soldering at one end thereof. The electrical conductor 44 is used in connection with a circuit (not shown) for controlling the actuation of the device (described hereinafter) or door 14, as is understood by those skilled in the art, in response to the application of force to the sheath 24, as described hereinafter.

The first sheet of flexible, electrically conductive material 42 is in engagement with a layer of non-conductive material 46 having a first face 46a and a second face 46b for spacing apart the first sheet of flexible, electrically conductive material 42 and a second sheet of flexible, electrically conductive material 48 described hereinafter. The first face 46a of the layer of nonconductive material 46 is in engagement or corresponding facing relationship with the second face 42b of the first sheet of flexible, electrically conductive material 42.

The layer of non-conductive material 46 has at least one opening 50 extending therethrough between the first and second faces 46a, 46b thereof. As shown in FIG. 3, the layer of non-conductive material 46, preferably includes a plurality of openings 50 interspersed therealong for allowing the actuation of the force sensing switch 39 by applying pressure thereto, as described hereinafter. In the present embodiment, it is preferred that the openings 50 be generally oval-shaped in cross-section. However, it is within the spirit and scope of the invention to configure the openings 50 of any geometric shape, such as square or circular.

The layer of non-conductive material 46 is preferably constructed of generally soft foam rubber. It is understood by those skilled in the art, that the layer of non-conductive material 46 can be constructed of either closed or open cell foam rubber or other materials having similar properties, so long as the function of the force sensing switch 39 is achieved, as described hereinafter.

The layer of non-conductive material 46 is in engagement with a second sheet of flexible electrically conductive material 48 having a first face 48a and a second face 48b. The first face 48a of the second sheet of flexible, electrically conductive material 48 is in engagement or corresponding facing relationship with the second face 46b of the layer of non-conductive material 46.

In the present embodiment, it is preferred that the second sheet of flexible, electrically conductive material 48 be constructed of the same material and configuration as the first sheet of flexible, electrically conductive material 42. Similarly, the second sheet of flexible, electrically conductive material 48 is connected to an electrical conductor or wire 52 for connection with a circuit for controlling the actuation of the door 14 or device in response to the application of force to the sheath 24.

In engagement with the second sheet of flexible, electrically conductive material 48 is a second sheet of resiliently compressible material 54 having a first face 54a and a second face 54b. The first face 54a of the second sheet of resiliently compressible material 54 is in engagement or corresponding facing relationship with the second face 48b of the second sheet of flexible, electrically conductive material 48.

The second sheet of resiliently compressible material 54 is preferably constructed of the same material and configured generally identically to the first sheet of resiliently compressible material 40. However, it is apparent to those skilled in the art, that the first and second sheets of resiliently compressible material 40, 54 can differ in configuration, size and/or material.

Figure 6:
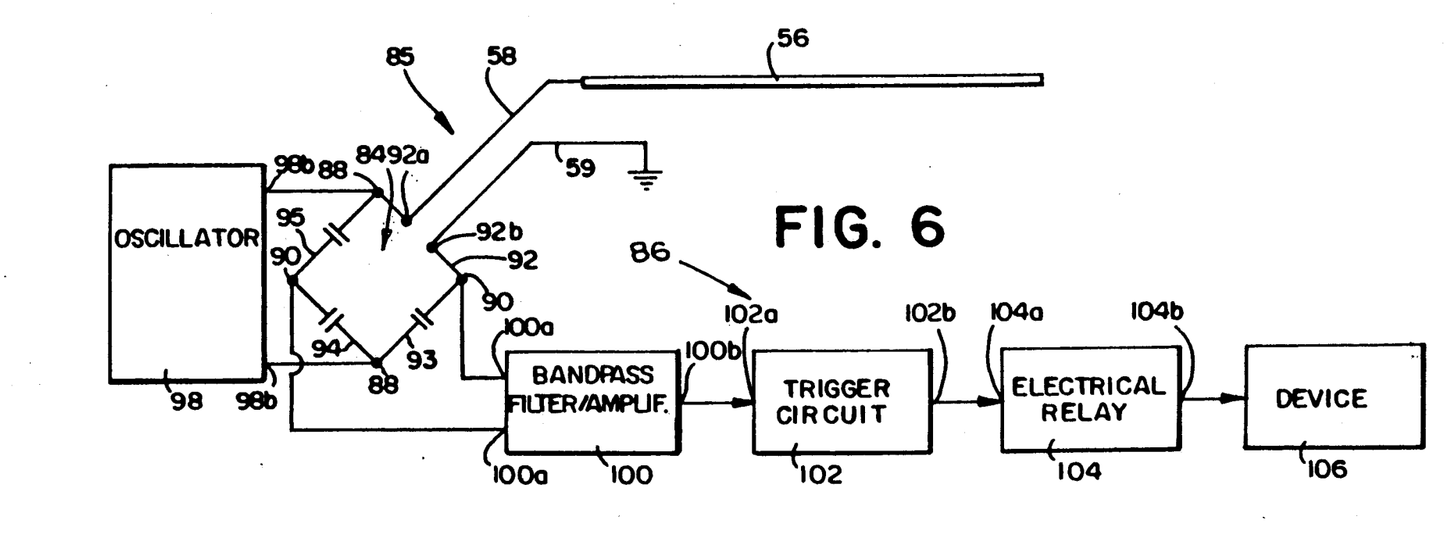
FIG. 6 is a schematic diagram of a proximity sensor in accordance with the present invention.

Referring now to FIGS. 2, 3 and 6, just below the second sheet of resiliently compressible material 54 is an electrode 56 having a first face 56a and a second face 56b. The first face 56a of the electrode 56 is in engagement with the second face 54b of the second sheet of resiliently compressible material 54. The second face 56b of the electrode 56 is in engagement with the lower wall 34 of the sheath 24. The purpose and function of the electrode 56 are described hereinafter in more detail.

In the present embodiment, it is preferred that the electrode 56 be constructed of the same material and configuration as the first and second sheets of flexible, electrically conductive material 42, 48. Alternatively, it is within the spirit and scope of the invention and understood by those skilled in the art, that either the first sheet of electrically conductive material 42 or the second sheet of electrically conductive material 48 could be used as the electrode thus serving a dual purpose. Furthermore, it is understood by those skilled in the art, that the electrode 56 is not limited to the material and general configuration of the sheets of electrically conductive material 42, 48. For instance, the electrode 56 could be a thin copper wire. Also the placement of the electrode 56 is not limited as heretofore described. For instance, the electrode 56 can be placed anywhere inside the sheath 24, as long as the operation of the force sensing switch 39 is not obstructed. Additionally, the electrode 56 can be positioned externally of the sheath 24. As shown in FIGS. 3 and 6, the electrode 56 is connected to an electrical conductor or wire 58 for connection with a capacitance bridge circuit 84, hereinafter described.

As shown in FIG. 3, the first and second sheets of flexible, electrically conductive material 42, 48 are spaced apart by the layer of non-conductive material 46 and present opposed portions to each other through the openings 50. Upon the application of force to the sheath 24, a portion of at least one of the first and second sheets of flexible, electrically conductive material 42, 48 deflects into at least one of the openings 50 in the layer of non-conductive material 46, and makes electrical contact between the first and second sheets of flexible, electrically conductive material 42, 48 to thereby actuate the device.

Figure 4:
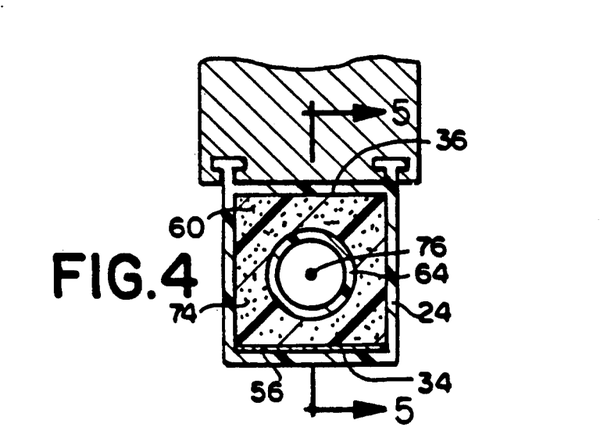
FIG. 4 is a greatly enlarged cross-sectional view of the sensing edge of FIG. 1 in accordance with an alternate embodiment of the invention taken along line 2—2 of FIG. 1.
Figure 5:
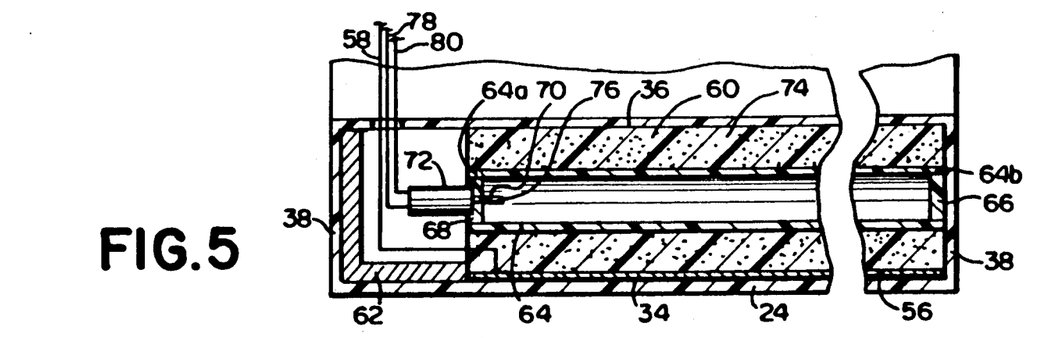
FIG. 5 is a cross-sectional view of the sensing edge shown in FIG. 4 taken along line 5—5 of FIG. 4.

Referring now to FIGS. 4 and 5, an alternate embodiment is shown. In the alternate embodiment the force sensing means preferably comprises a pressure sensitive switch assembly 60 instead of the force sensing switch 39.

Referring to FIG. 4, in the alternate embodiment, end walls 38 close and seal the sheath 24. Provided on a portion of the interior of the sheath 24 at one end thereof is a relatively stiff or rigid incompressible transverse structure 62 extending completely across the sheath 24, so as to effectively prevent or minimize compression and deformation of the sheath 24 at that location.

In the alternate embodiment, transverse structure 62 is generally L-shaped in cross section and positioned at the left hand end of the sheath 24 (when viewing FIG. 5). The L-shaped transverse structure 62 is of a configuration which complements the internal cross-sectional configuration of the sheath 24, and is fabricated of relatively stiff, incompressible material, such as rubber, metal, plastic, or any material having similar properties. The transverse structure 62 may be of any other shape, such as C-shaped, as long as it effectively prevents compression and deformation of the surrounding portion of the sheath 24. For instance, the transverse structure 62 of the alternate embodiment, may include bores or holes (not shown) to decrease shipping weight, without detracting from the requirement of a rigid structure.

Disposed generally centrally within the sheath 24, is an elongate inner tubular member 64 fabricated of resiliently compressible air impervious material, such as rubber or closed cell foam. The tubular member 64 extends almost the complete length of the sheath 24 and is longitudinally positioned and completely enclosed within the sheath 24.

In the alternate embodiment, the tubular member 64 is generally of circular cross section (see FIG. 4), but may be of other cross-sectional shapes, such as square or oval (not shown). The tubular member 64 has first and second ends 64a and 64b, respectively, and extends longitudinally into abutting engagement with the second or right hand end wall 38 of the sheath 24 (when viewing FIG. 5).

Positioned within the second end 64b of the tubular member 64 is a first plug 66 which is of a configuration conformable to the internal cross section of the tubular member 64 and sealingly positioned therein so as to prevent air from escaping between the first plug 66 and the tubular member 64. In the alternate embodiment, the first plug 66 is sealed in position with epoxy, however, any suitable sealant (e.g., glue or cement) may alternatively be employed. The first plug 66 may be constructed of any suitable rigid or stiff material. In the alternate embodiment, the plug 66 is constructed of foam rubber, but may be constructed of plastic. If desired, the tubular member 64 may be formed with the second or right hand end permanently sealed (not shown), such that the first plug 66 is an integral part thereof.

The other or first end 64a of the tubular member 64 preferably extends up to the transverse structure 62. Positioned within the first end 64a (left hand end when viewing FIG. 5) of the tubular member 64 is a second plug 68 which is also of a configuration conformable to the internal cross-sectional configuration of the tubular member 64, and fabricated of relatively stiff material, such as foam rubber or plastic. The second plug 68 is sealingly secured within the tubular member 64 as with the first plug 66. The second plug 68 further includes a generally centrally disposed bore 70 for receiving a pressure sensing switch element 72 for sensing pressure change within the tubular member 64.

Disposed in the area between the sheath 24 and the tubular member 64 is a resiliently compressible inner formation 74 which extends generally along the entire length of the tubular member 64 (see FIG. 5). In the present embodiment, the resiliently compressible inner formation 74 is preferably fabricated essentially of open cell foam and is substantially co-extensive with the sheath 24, except for the space occupied by the transverse structure 62.

It is within the spirit and scope of the invention, to construct the resiliently compressible inner formation 74 of other materials, such as a close cell foam. While on the other hand, it should be understood that the resiliently compressible inner formation 74 is not necessary for operation of the sensing edge 24 and, therefore, may not be included. Thus, the area between the inner tubular member 64 and the sheath 24 may be open. However, without resiliently compressible inner formation 74, the sensitivity of sensing edge 16 decreases.

As shown in FIGS. 4 and 5, an electrode 56 (the material and configuration of which has heretofore been described in the preferred embodiment) is positioned between the resiliently compressible inner formation 74 and the lower interior surface 34 of the sheath 24. However, as in the preferred embodiment, the electrode 56 can be placed anywhere inside the sheath 24, as long as the operation of the pressure sensitive switch assembly 60 is not obstructed. Additionally, the electrode 56 can be located externally of the sheath 24 without deviating from the spirit and scope of the invention. As shown in FIG. 5 and 6, the electrode 56 is connected to an electrical conductor or wire 58 for connection with a capacitance bridge circuit 84, hereinafter described.

Referring now to FIG. 5, protectively located between the transverse structure 62 and the first end 64a of the tubular member 64 is a pressure sensing means. The pressure sensing means senses pressure change within the interior of the tubular member 64. In the present embodiment, the pressure sensing means comprises a fluid pressure sensitive switch element 72, in which electrical contact is made or broken in response to pressure changes. The switch element 72 is a type well known in the art. Such pressure sensitive switch elements are manufactured by Micropneumatic Logic, Inc. of Fort Lauderdale, Fla.

The pressure sensitive switch element 72 is effectively protected from direct pressure and/or impact damage by imbedding or otherwise enclosing the switch element 72 within the transverse structure 62. If desired, the switch element 72 may also be encased with protective material, such as foam (not shown) installed within the upper surface 36 of the sheath 24 proximate the transverse structure 62.

The switch element 72 includes a pressure port or nipple 76 extending through plug bore 70 and communicating with the interior of the tubular member 64. Thus, the switch element 72 is in pneumatic communication from its mounting in the transverse structure 62 with the interior of tubular member 64. The pressure sensitive switch element 72 is provided with electrical conductors or leads 78 and 80 which extend outwardly in sealed relation from the sheath 24 for connection with desired control circuitry (not shown) for controlling the door 14.

Upon the application of an external force to the sheath 24 caused by an obstruction to the closing of the door 14 anywhere therealong (except at the location of the transverse structure 62), the compressible inner formation 74 (or the air within the outer sheath if no compressible inner formation is employed) communicates the force to the tubular member 64 which is depressed in an amount proportional to the magnitude of the external force. A slight depression in the tubular member 64 increases the internal pressure therewithin and is sensed by the pressure sensitive switch element 72 which actuates by making or breaking electrical contact in a manner well known in the art to effect a desired result, generally, the automatic opening of the door 14 or the automatic inhibiting of the door 14 from closing any further.

It is within the spirit and scope of the present invention and understood by those skilled in the art, that the force sensing means is not limited to either the means described in the preferred embodiment or the alternate embodiment. Furthermore, two or more force sensing means could be used together to provide redundancy with respect to the force sensing means without deviating from the scope and spirit of the invention.

Referring now to FIGS. 2, 3 and 6 wherein the preferred embodiment is depicted, there is shown a proximity sensing means. Although the description of the proximity sensing means is hereinafter recited in conjunction with the preferred embodiment, it is understood that the alternate embodiment contains the same proximity sensing means.

In the preferred embodiment, it is preferred that the proximity sensing means be positioned proximate the lower wall 34 of the sheath 24 for sensing the presence of an animate object in proximity to the sheath 24 and for actuating the device upon detection of an animate object in proximity to the sheath 24.

Referring now to FIG. 6, in the preferred embodiment, the proximity sensing means comprises an electrical circuit 85 positioned proximate the lower wall 34 of the sheath 24 and a control circuit 86 in electrical communication with the electrical circuit 85. As hereinafter described in greater detail, the control circuit 86 detects changes in the capacitance of the electrical circuit 85 and actuates the device 106 in response to a detected change in the capacitance of the electrical circuit 85 which exceeds a predetermined limit. Thus, the control circuit 86 actuates the device 106 in response to detecting a change in the capacitance of the electrical circuit 85 due to the presence of an animate object in proximity to the sensing edge 16.

As shown in FIG. 6, the electrical circuit 85 comprises an electrode 56 positioned within the sheath 24 (also shown in FIGS. 2 and 3) and a capacitance bridge circuit 84 in electrical communication with the control circuit 86. Referring to FIG. 2, in the presently preferred embodiment, the electrode 56 is positioned within the sheath 24 between the second face 54b of the second sheet of resiliently compressible material 54 and the lower wall 34 of the sheath 24 (placement of electrode 56 is shown in FIGS. 4 and 5 for the alternate embodiment). However, as heretofore discussed, it is within the spirit and scope of this invention to position the electrode anywhere proximate the sheath 24, whether inside the sheath 24 or outside the sheath 24.

Referring to FIG. 6, the capacitance bridge circuit 84 has an input 88 and an output 90. In the preferred embodiment, the capacitance bridge circuit has four capacitive branches 92, 93, 94, 95, although it is understood by those skilled in the art, that the functionality of the capacitance bridge circuit 84, hereinafter described, can be achieved with more or less branches (not shown) which may or may not include other electrical elements such as resistors and inductors (not shown). For instance, the capacitance bridge circuit 84 could be comprised of two branches.

In the presently preferred embodiment, the branch 92 of the capacitance bridge circuit 84 has a first end 92a and a second end 92b. The first end 92a is in electrical communication with the electrode 56 by a conductor or wire 58. The second end 92b of the capacitance bridge circuit 84 is grounded through the conductor or wire 59. It is understood by those skilled in the art, that the electrode 56 and ground could be connected to any one of the branches 92, 93, 94, 95 of the capacitance bridge circuit 84, and it is further understood by those skilled in the art, that more than one electrode 56 could be used (not shown). The capacitance bridge circuit 84 is initially in a balanced condition, however, the presence of an animate object in proximity to the electrode 56 operates to change the capacitance between the electrode 56 and ground to unbalance the capacitance bridge circuit 84.

As shown in FIG. 6 and as mentioned previously, the control circuit 86 is in electrical communication with the electrical circuit 85 for detecting changes in the capacitance of the electrical circuit 85. It is understood by those skilled in the art, that the control circuit 86, hereinafter described, is not limited to any one electrical implementation, but can be implemented in many ways (not shown).

In the presently preferred embodiment, the control circuit 86 comprises an oscillator 98 having an output 98b and a bandpass filter/amplifier 100, a trigger circuit 102 and an electrical relay 104 each having an input 100a, 102a, 104a and an output 100b, 102b, 104b, respectively. The output 98b of the oscillator 98 is in electrical communication with the input 88 of the capacitance bridge circuit 84 for transmitting an oscillating electrical signal to the capacitance bridge circuit 84.

The output 90 of the capacitance bridge circuit 84 is in electrical communication with the input 100a of the bandpass filter/amplifier 100. The bandpass filter/amplifier 100 amplifies transmitted oscillating electrical signals which have passed through the capacitance bridge circuit 84. The output 100b of the bandpass filter/amplifier 100 is in electrical communication with the input 102a of the trigger circuit 102. The trigger circuit 102 detects an output signal amplitude from the bandpass filter/amplifier 100 and compares the amplitude of that signal to a predetermined limit for generating an output signal when the detected signal amplitude exceeds a predetermined limit. The output 102b of the trigger circuit 102 is in electrical communication with the input 104a of the electrical relay 104. The output 104b of the electrical relay 104 is in electrical communication with the device 106. In a manner well known to those skilled in the art, upon receiving a signal from the trigger circuit 102, the relay 104 changes from its first electrical or initial state to a second electrical or triggered state thereby actuating the device 106.

It is understood by those skilled in the art, that the oscillator 98, bandpass filter/amplifier 100, trigger circuit 102, electrical relay 104 and the device 106 are standard instruments and, therefore, for purposes of convenience only, further description thereof is neither necessary nor limiting.

In operation, the oscillator 98 constantly transmits an oscillating electrical signal to the input 88 of the capacitance bridge circuit 84. When no animate object is in proximity to the electrode 56 positioned within the sheath 24 of the sensing edge 16, the capacitance bridge circuit 84 is in a balanced condition. In the balanced condition, the capacitance bridge circuit 84 blocks the oscillating electrical signal from passing therethrough. Thus, there is no electrical signal transmitted from the output 90 of the capacitance bridge circuit 84 to the rest of the control circuit 86 and, therefore, the device 106 is not actuated.

However, as is understood by those skilled in the art, the presence of an animate object in proximity to the sensing edge 16 changes the natural capacitance between the electrode 56 and ground and, therefore, changes the capacitance of the branch 92 of the capacitance bridge circuit 84 to which the electrode 56 is connected by wire 58. This change in capacitance unbalances the capacitance bridge circuit 84. An unbalanced capacitance bridge circuit allows a signal transmitted to its input to pass through the circuit and be transmitted from its output. Thus, the presence of an animate object in proximity to the sensing edge 16 unbalances the capacitance bridge circuit 84 allowing the oscillating electrical signal from the oscillator 98 to pass through the capacitance bridge circuit 84.

The oscillating electrical signal is then transmitted from the output 90 of the capacitance bridge circuit 84 to the bandpass filter/amplifier 100 which amplifies the signal. The amplified signal is then transmitted to the trigger circuit 102. The trigger circuit 102 compares the amplitude of the amplified signal to a predetermined limit. Upon the amplitude of the amplified signal exceeding the predetermined limit, the trigger circuit 102 transmits an electrical signal to the electrical relay 104. In a manner well known to those skilled in the art, the electrical relay 104 responds to the signal from the trigger circuit 102 by changing from its first electrical or initial state to its second electrical or triggered state thereby actuating the device 106. Thus, the door 14 ceases to move or opens, and no harm to the animate object (not shown) occurs.

The sensitivity of the trigger circuit 102 and, therefore, the sensitivity of the proximity sensing means is adjustable. The degree to which the capacitance bridge circuit 84 allows the oscillating electrical signal to pass therethrough is inversely proportional to the distance between the electrode 56 and the animate object. Thus, the amplitude of the signal which reaches the trigger circuit 102 is similarly inversely proportional to the distance between the electrode 56 and the animate object (not shown). Therefore, by changing the predetermined limit in the trigger circuit 102, the sensitivity of the control circuit 86 is adjusted. The functionality of the trigger circuit 102, herein described, is well known to those skilled in the art and can be implemented in many ways. Without deviating from the spirit and scope of the present invention, the trigger circuit 102 is not limited to any one electrical implementation.

In use, the sheath 24 is connected to the door 14 using the T-shaped members 20 as described above. The electrical wires 44, 52 in the preferred embodiment (78, 80 in the alternate embodiment) are connected to the device for controlling the actuation of the door 14. In both the preferred embodiment and the alternate embodiment, the force sensing switch 39 and the pressure sensitive switch 60 operate simultaneously with the proximity sensing means, such that the device is actuated in response to either the detection of an animate object in proximity to the sheath 24 or the sensing of the application of a force to the sheath 24. Specifically, as an animate object moves in proximity to the sensing edge 16, the proximity sensing means detects the presence of the animate object and actuates the device 106 to stop or reverse the motion of the door 14.

However, if an inanimate object, one which does not effect the capacitance between the electrode 56 and ground, moves in proximity to the door edge 16, or if an animate object moves in proximity to the door edge 16, but the proximity sensing means fails to operate, the door 14 moves into the object such that a force is applied to the exterior surface 28 of the sheath 24. In the preferred embodiment, upon the application of force to the sheath 24, a portion of at least one of the first and second sheets of flexible, electrically conductive material 42, 48 deflects into at least one of the openings 50 in the layer of non-conductive material 46 and makes electrical contact between the first and second sheets of electrically conductive material 42, 48 to thereby actuate the device and control the motion of the door 14.

In the alternate embodiment, upon the application of force to the sheath 24, pressure within the inner tubular member 64 increases and is communicated to the pressure sensitive switch element 72 to actuate the device 106 and control the door 14. Thus, in either embodiment, the door 14 ceases to move or moves to an open position upon the application of force to the sheath 24, thereby providing the sensing edge 16 with redundancy.

From the foregoing description, it can be seen that the present invention comprises a redundant sensing edge for a door to protect persons, equipment and the door from impact damage by actuating a device upon detecting an object in proximity to the door edge. The sensing edge of the present invention overcomes the problems inherent in the prior art by providing a sensing edge capable of actuating the device for controlling the door before impact occurs and providing redundancy in the event that the proximity sensing means ceases to operate. Furthermore, the proximity sensing means of the present invention is easier to manufacture and implement than the proximity sensing means of the prior art. It will be appreciated by those skilled in the art, that changes could be made to the embodiment described above without departing from the broad inventive concepts thereof. It is understood, therefore, that this invention is not limited to the particular embodiment disclosed, but is intended to cover all modifications which are within the scope and spirit of the invention as defined by the appended claims.

We claim:

1. A redundant sensing edge for a door to protect persons, equipment and the door from impact damage by actuating a device upon detecting an object in proximity to the door edge, said sensing edge comprising:

an elongate outer sheath compressible upon application of external pressure, said sheath having a wall with an interior surface and an exterior surface, said sheath for being attached to the door edge;

force sensing means at least partially positioned within said sheath for sensing the application of a force upon said sheath and for actuating the device upon the sensing of a force being applied to said sheath; and proximity sensing means positioned proximate said wall of said sheath for sensing the presence of an animate object in proximity to said sheath and for actuating the device upon detection of an animate object in proximity to said sheath, whereby the device is actuated either upon the detected presence of an animate object in proximity to said sheath or upon the application of a force to the sheath.

2. The sensing edge as recited in claim 1, wherein said proximity sensing means comprises:
   an electrical circuit positioned proximate said wall of said sheath; and
   a control circuit in electrical communication with said electrical circuit for detecting changes in the capacitance of said electrical circuit and for actuating the device in response to a detected change in the capacitance of said electrical circuit which exceeds a predetermined limit, whereby said control circuit actuates the device in response to detecting a change in the capacitance of said electrical circuit due to the presence of an animate object in proximity to said sensing edge.

3. The sensing edge as recited in claim 2, wherein said electrical circuit comprises:
   an electrode positioned proximate said wall of said sheath; and
   a capacitance bridge circuit having an input, an output and at least two branches, one of said branches having a first end and a second end, said first end being in electrical communication with said electrode and said second end being grounded, said capacitance bridge circuit initially being in a balanced condition, the presence of an animate object in proximity to said electrode operating to change the capacitance between said electrode and ground to unbalance said capacitance bridge circuit.

4. The sensing edge as recited in claim 3, wherein said control circuit comprises:
   an oscillator having an output in electrical communication with the input of said capacitance bridge circuit for transmitting an oscillating electrical signal to said capacitance bridge circuit;
   a bandpass filter/amplifier having an input and an output, the input of said bandpass filter/amplifier being in electrical communication with the output of said capacitance bridge circuit for amplifying transmitted oscillating electrical signals which have passed through said capacitance bridge circuit;
   a trigger circuit having an input and an output, the input of said trigger circuit being in electrical communication with the output of said bandpass filter/amplifier for detecting an output signal amplitude from said bandpass filter/amplifier and for generating an output signal when the detected signal exceeds a predetermined limit;
   an electrical relay having an input, an output, a first electrical state and a second electrical state, the input of said electrical relay being in electrical communication with the output of said trigger circuit, the output of said electrical relay being in electrical communication with the device, whereby the presence of an animate object in proximity to said sensing edge changes the capacitance between said electrode and ground and unbalances said capacitance bridge circuit, such that the oscillating electrical signal passes through said capacitance bridge circuit to the input of said bandpass filter/amplifier, said bandpass filter/amplifier amplifies and transmits the oscillating electrical signal to the input of said trigger circuit, said trigger circuit compares the amplitude of the received oscillating electrical signal to a predetermined limit and upon the amplitude of the oscillating electrical signal exceeding the limit, transmits an electrical signal to the input of said electrical relay, whereupon said relay changes from said first electrical state to said second electrical state thereby actuating the device.

5. The sensing edge as recited in claim 3, wherein said electrode is positioned within said sheath.

6. The sensing edge as recited in claim 1, wherein said force sensing means comprises:
   a first sheet of resiliently compressible material having a first face and a second face, said first face of said first sheet of resiliently compressible material being in engagement with said interior surface of said sheath;
   a first sheet of flexible, electrically conductive material having a first face and a second face, said first face of said first sheet of flexible, electrically conductive material being in engagement with said second face of said first sheet of resiliently compressible material;
   a layer of non-conductive material having a first face and a second face, said first face of said layer of non-conductive material being in engagement with said second face of said first sheet of flexible, electrically conductive material, said layer of non-conductive material including at least one opening extending therethrough between said first and second faces thereof;
   a second sheet of flexible, electrically conductive material having a first face and a second face, said first face of said second sheet of flexible, electrically conductive material being in engagement with said second face of said layer of non-conductive material;
   a second sheet of resiliently compressible material having a first face and a second face, said first face of said second sheet of resiliently compressible material being in engagement with said second face of said second sheet of flexible, electrically conductive material, said second face of said second sheet of resiliently compressible material being in engagement with said interior surface of said sheath, said first and second sheets of flexible, electrically conductive material being spaced apart by said layer of nonconductive material and presenting opposed portions to each other through said opening whereby upon the application of force to said sheath, a portion of at least one of said first and second sheets of flexible, electrically conductive material deflects into the opening in said layer of non-conductive material and makes electrical contact between said first and second sheets of flexible, electrically conductive material, to thereby actuate the device.

7. The sensing edge as recited in claim 6, wherein said proximity sensing means comprises:
   an electrical circuit positioned proximate said wall of said sheath; and
   a control circuit in electrical communication with said electrical circuit for detecting changes in the capacitance of said electrical circuit and for actuating the device in response to a detected change in the capacitance of said electrical circuit which exceeds a predetermined limit, whereby said control circuit actuates the device in response to detecting a change in the capacitance of said electrical circuit due to the presence of an animate object in proximity to said sensing edge.

8. The sensing edge as recited in claim 7, wherein said electrical circuit comprises:
an electrode positioned proximate said wall of said sheath; and
a capacitance bridge circuit having an input, an output and at least two branches, one of said branches having a first end and a second end, said first end being in electrical communication with said electrode and said second end being grounded, said capacitance bridge circuit being in a balanced condition, the presence of an animate object in proximity to said electrode operating to change the capacitance between said electrode and ground to unbalance said capacitance bridge circuit.

9. The sensing edge as recited in claim 8, wherein said electrode is one of said sheets of flexible, electrically conductive material.

10. The sensing edge as recited in claim 1, wherein said force sensing means comprises:
an elongate inner tubular member fabricated of resiliently compressible air impervious material longitudinally positioned and enclosed within said sheath, said inner tubular member having a first end and a second end, said second end being sealingly closed;
a substantially rigid, incompressible transverse structure positioned within a portion of the outer sheath and having a configuration which compliments the interior cross section of said sheath to effectively prevent deformation of said sheath thereabout; and
a pressure sensitive switch having a switch element protectively located within the portion of said sheath proximate said transverse structure for sensing pressure change within said inner tubular member without subjecting the switch element to direct external pressure whereby upon the application of external pressure to the sheath, anywhere therealong except at the portion encompassing said transverse structure, pressure within the tubular member is increased and thereby communicated to the pressure switch for actuation thereof.

11. The sensing edge as recited in claim 10, wherein an area is defined between said inner tubular member and said sheath and further including a resiliently compressible material configured to conformably occupy an area between said inner tubular member and said sheath.

12. The sensing edge as recited in claim 10, wherein said transverse structure is positioned at said first end of said tubular member.

13. A method of protecting persons, equipment and a door from impact damage by actuating a device upon detecting an object in proximity to the door edge, the door edge having an elongate outer sheath attached thereto, said sheath being compressible upon application of external pressure, said sheath having a wall with an interior surface and exterior surface, said sheath including force sensing means for actuating the device upon the sensing of a force being applied thereto and proximity sensing means for actuating the device upon detection of an animate object in proximity thereto, said method comprising the steps of:
sensing a force being applied to the sheath;
detecting an animate object in proximity to the sheath with said proximity sensing means; and
actuating the device in response to either the detection of the presence of an animate object in proximity to the sheath or the sensing of the application of a force to the sheath.

* * * * *